United States Patent
Matsuda et al.

(10) Patent No.: US 8,603,624 B2
(45) Date of Patent: Dec. 10, 2013

(54) PREPREG, LAMINATE, METAL CLAD LAMINATE, CIRCUIT BOARD, AND CIRCUIT BOARD FOR LED MOUNTING

(75) Inventors: Takashi Matsuda, Fukushima (JP); Kiyotaka Komori, Fukushima (JP); Akiyoshi Nozue, Mie (JP); Takayuki Suzue, Mie (JP); Mitsuyoshi Nishino, Fukushima (JP); Toshiyuki Asahi, Osaka (JP); Yoshito Kitagawa, Osaka (JP); Naoyuki Tani, Osaka (JP)

(73) Assignee: Panasonic Corporation, Osaka (JP)

( * ) Notice: Subject to any disclaimer, the term of this patent is extended or adjusted under 35 U.S.C. 154(b) by 54 days.

(21) Appl. No.: 13/510,770

(22) PCT Filed: Oct. 29, 2010

(86) PCT No.: PCT/JP2010/006415
§ 371 (c)(1),
(2), (4) Date: May 18, 2012

(87) PCT Pub. No.: WO2011/061894
PCT Pub. Date: May 26, 2011

(65) Prior Publication Data
US 2012/0228010 A1    Sep. 13, 2012

(30) Foreign Application Priority Data
Nov. 20, 2009 (JP) ................. 2009-265440

(51) Int. Cl.
*B32B 15/00* (2006.01)
(52) U.S. Cl.
USPC ........ 428/323; 428/209; 428/297.4; 428/325; 428/327; 428/329; 174/258
(58) Field of Classification Search
USPC .............. 428/209, 297.4, 323, 325, 327, 329, 428/330
See application file for complete search history.

(56) References Cited

U.S. PATENT DOCUMENTS

| | | | |
|---|---|---|---|
| 6,280,839 B1 * | 8/2001 | Brown et al. | 428/328 |
| 6,514,477 B2 | 2/2003 | Brown et al. | |

(Continued)

FOREIGN PATENT DOCUMENTS

| | | |
|---|---|---|
| JP | 62-173245 | 7/1987 |
| JP | 2-20558 | 1/1990 |

(Continued)

OTHER PUBLICATIONS

International Search Report issued Jan. 18, 2011 in International (PCT) Application No. PCT/JP2010/006415.

*Primary Examiner* — Cathy Lam
(74) *Attorney, Agent, or Firm* — Wenderoth, Lind & Ponack, L.L.P.

(57) ABSTRACT

Disclosed is a prepreg obtained by impregnating a woven fabric base with a thermosetting resin composition, wherein the thermosetting resin composition contains 80 to 200 volume parts of an inorganic filler per 100 volume parts of a thermosetting resin, and the inorganic filler contains (A) gibbsite aluminum hydroxide particles having an average particle diameter ($D_{50}$) of 2 to 15 μm, (B) at least one inorganic component selected from the group consisting of boehmite particles having an average particle diameter ($D_{50}$) of 2 to 15 μm and inorganic particles that have an average particle diameter ($D_{50}$) of 2 to 15 μm and that contain crystal water having a release initiation temperature of 400° C. or higher or contain no crystal water, and (C) aluminum oxide particles having an average particle diameter ($D_{50}$) of 1.5 μm or smaller, the compounded ratio (volume ratio) of the gibbsite aluminum hydroxide particles (A), the at least one inorganic component (B) selected from the group consisting of the boehmite particles and the inorganic particles, and the aluminum oxide particles (C) being 1:0.1 to 2.5:0.1 to 1.

8 Claims, 2 Drawing Sheets

(56) References Cited

U.S. PATENT DOCUMENTS

| | | | |
|---|---|---|---|
| 6,855,892 B2 * | 2/2005 | Komatsu et al. | 174/256 |
| 7,029,746 B2 * | 4/2006 | Brown et al. | 428/209 |
| 7,063,883 B2 * | 6/2006 | Brown et al. | 428/209 |
| 7,601,429 B2 * | 10/2009 | Kato et al. | 428/458 |
| 8,324,313 B2 * | 12/2012 | Funahashi | 524/588 |

FOREIGN PATENT DOCUMENTS

| | | |
|---|---|---|
| JP | 2-286238 | 11/1990 |
| JP | 2001-508002 | 6/2001 |
| JP | 2001-223450 | 8/2001 |
| JP | 2004-149577 | 5/2004 |
| JP | 2006-257309 | 9/2006 |
| JP | 2007-146095 | 6/2007 |
| JP | 2007-224269 | 9/2007 |
| JP | 2007-326956 | 12/2007 |
| JP | 2009-263662 | 11/2009 |
| WO | 2009/136542 | 11/2009 |
| WO | 2009/142192 | 11/2009 |

* cited by examiner

PREPREG, LAMINATE, METAL CLAD LAMINATE, CIRCUIT BOARD, AND CIRCUIT BOARD FOR LED MOUNTING

TECHNICAL FIELD

The present invention relates to a prepreg for use in the field of circuit boards for various electronic devices, and particularly to a prepreg with excellent heat dissipation properties and to a laminate, a metal clad laminate, a circuit board and a circuit board for LED mounting manufactured using this prepreg.

BACKGROUND ART

A type of laminate called an FR-4 obtained by laminate molding a prepreg consisting of fiberglass cloth impregnated with an epoxy resin or other resin component is widely used as a typical laminate in printed wiring boards for electronic devices. The term FR-4 is a category established by the U.S. National Electrical Manufacturers Association (NEMA). So-called CEM-3 type composite laminates, which are composed of a core layer of nonwoven cloth impregnated with a resin component, laminated on both sides with surface layers of fiberglass cloth impregnated with a resin component, are also known.

For example, Patent Document 1 below proposes a composite laminate with high interlayer adhesive strength and excellent alkali resistance, heat resistance and punching quality, comprising a resin-impregnated surface material of fiberglass cloth impregnated with resin varnish, affixed to both sides of a resin-impregnated core material of nonwoven cloth and/or paper impregnated with resin varnish, and further clad with a metal foil. In this composite laminate, the resin varnish used in the core material contains a filler combining talc and aluminum hydroxide, with the compounded ratio of talc to aluminum hydroxide being 0.15:1 to 0.65:1, and the aluminum hydroxide is described as being of the boehmite type.

Also, for example, Patent Document 2 below describes a composite laminate with excellent thermal stability and fire retardancy, which is a laminate for printed circuit boards composed of surface layers of resin-impregnated fiberglass woven cloth and a middle layer of fiberglass nonwoven cloth impregnated with a hardening resin. In this laminate, the middle layer is described as containing an aluminum hydroxide of the chemical formula $Al_2O_3 \cdot nH_2O$ (wherein n has a value greater than 2.6 and smaller than 2.9) in the amount of 200 wt % to 275 wt % of the resin in the middle layer.

As electronic devices have become lighter and more compact in recent years, electronic parts are being mounted at higher densities on printed wiring boards, and these electronic parts may include multiple LEDs (light-emitting diodes) and the like that require heat dissipation. The problem has been that conventional laminates lack adequate heat dissipation properties as substrates for such purposes. Moreover, the most common mounting method is by reflow soldering, and lead-free reflow solder, which requires a high-temperature reflow process, has come to predominate in reflow soldering because of its low environmental impact. In reflow soldering using such lead-free solder, high heat resistance is required in order to control blistering and the like. It is also necessary to maintain drilling performance. From a safety standpoint, moreover, fire retardancy must be at the V-0 level according to the Ul-94 standard.

Patent Document 1: Japanese Patent Application Laid-Open No. S62-173245
Patent Document 2: Japanese Translation of PCT Application No. 2001-508002

SUMMARY OF THE INVENTION

In light of the problems discussed above, it is an object of the present invention to provide a laminate with excellent thermal conductivity, heat resistance, drilling performance and fire retardancy.

One aspect of the present invention relates to a prepreg obtained by impregnating a woven fabric base with a thermosetting resin composition, which is a laminate in which the thermosetting resin composition contains 80 to 200 volume parts of an inorganic filler per 100 volume parts of a thermosetting resin, the inorganic filler comprises (A) gibbsite aluminum hydroxide particles having an average particle diameter ($D_{50}$) of 2 to 15 μm, (B) at least one inorganic component selected from the group consisting of boehmite particles having an average particle diameter ($D_{50}$) of 2 to 15 μm and inorganic particles that have an average particle diameter ($D_{50}$) of 2 to 15 μm and that contain crystal water having a release initiation temperature of 400° C. or higher or contain no crystal water, and (C) aluminum oxide particles having an average particle diameter ($D_{50}$) of 1.5 μm or smaller, and the compounded ratio (volume ratio) of the gibbsite aluminum hydroxide particles (A), the at least one inorganic component (B) selected from the group consisting of the boehmite particles and the inorganic particles, and the aluminum oxide particles (C) is 1:0.1 to 2.5:0.1 to 1 by volume.

Other aspects of the present invention relate to a metal clad laminate comprising a metal foil laid over at least one surface of the aforementioned prepreg, to a circuit board obtained by forming circuits on this metal clad laminate, and to a circuit board for LED mounting comprising this circuit board.

Objects, features, aspects and advantages of the present invention are made clear by the following detailed explanations and attached drawings.

DESCRIPTION OF EMBODIMENTS

Figure 1A:
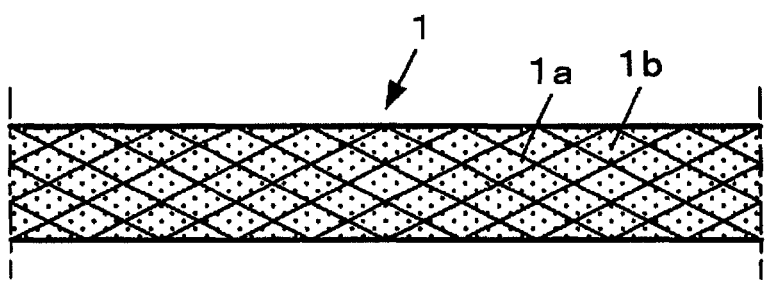
FIGS. 1A to 1C are a cross-sectional view of a prepreg of one embodiment of the present invention.

The prepreg of the present invention is obtained by impregnating a woven fabric base with a thermosetting resin composition.

[Thermosetting Resin Composition]

The thermosetting resin composition of a preferred embodiment of the present invention is explained first.

The researches of the inventors have shown that the heat dissipation properties of a laminate are improved when an aluminum hydroxide with excellent thermal conductivity is compounded with the aim of imparting heat dissipation properties to the laminate. Fire retardancy is also improved. However, the problem has been that compounding too much aluminum hydroxide greatly reduces the heat resistance of the laminate, which is then more liable to blisters and the like during solder reflow. When an aluminum oxide with excellent heat dissipation properties has been compounded instead of an aluminum hydroxide, there have been problems of reduced fire retardancy as well excessive wear of the drill blade during drilling, necessitating frequent changes of drill blade. When the compounded amount of the aluminum oxide has been reduced in order to control wear of the drill blade, the problem has been that sufficient thermal conductivity is not obtained. Thus, until now it has been difficult to obtain a prepreg that fulfills all the conditions of high thermal conductivity, high heat resistance, drilling performance and high fire retardancy.

The thermosetting resin composition of this embodiment contains 80 to 200 volume parts of an inorganic filler per 100 volume parts of a thermosetting resin, and the inorganic filler comprises (A) gibbsite aluminum hydroxide particles having an average particle diameter ($D_{50}$) of 2 to 15 μm, (B) at least one inorganic component selected from the group consisting of boehmite particles having an average particle diameter ($D_{50}$) of 2 to 15 μm and inorganic particles that have an average particle diameter ($D_{50}$) of 2 to 15 μm and that contain crystal water having a release initiation temperature of 400° C. or higher or contain no crystal water, and (C) aluminum oxide particles having an average particle diameter ($D_{50}$) of 1.5 μm or smaller, the compounded ratio (volume ratio) of the gibbsite aluminum hydroxide particles (A), the at least one inorganic component (B) selected from the group consisting of the boehmite particles and the inorganic particles, and the aluminum oxide particles (C) being 1:0.1 to 2.5:0.1 to 1 by volume.

Specific examples of the thermosetting resin include epoxy resins; unsaturated polyester resins, vinyl ester resins and other radical polymerizable thermosetting resins; and other liquid thermosetting resins. A curing agent or curing catalyst is compounded as necessary in the thermosetting resin. When using a radical polymerizable thermosetting resin, a radical polymerizable monomer such as styrene, diallyl phthalate or the like can be compounded as necessary. In any of these cases, a solvent may be compounded as necessary for purposes of adjusting viscosity and improving productivity.

The inorganic filler of this embodiment comprises gibbsite aluminum hydroxide particles (A), at least one inorganic component (B) selected from the group consisting of boehmite particles and inorganic particles that contain crystal water having a release initiation temperature of 400° C. or higher or contain no crystal water, and aluminum oxide particles (C).

The gibbsite aluminum hydroxide particles (A) are of an aluminum compound represented by $Al(OH)_3$ or $Al_2O_3 \cdot 3H_2O$, and are a component that imparts a good balance of thermal conductivity, fire retardancy and drilling performance to the laminate.

The average particle diameter ($D_{50}$) of the gibbsite aluminum hydroxide particles (A) is 2 to 15 μm, or preferably 3 to 10 μm. If the average particle diameter ($D_{50}$) of the gibbsite aluminum hydroxide particles (A) exceeds 15 μm, drilling performance is reduced, while if it is less than 2 μm, both thermal conductivity and productivity are reduced. As the gibbsite aluminum hydroxide particles, using a compounded mixture of first gibbsite aluminum hydroxide particles having an average particle diameter ($D_{50}$) of 2 to 10 μm and second gibbsite aluminum hydroxide particles having an average particle diameter ($D_{50}$) of 10 to 15 μm is desirable for further improving the heat dissipation properties because the filler can be more densely filled.

The average particle diameter ($D_{50}$) in this embodiment is the particle diameter at the 50% point on a cumulative curve determined with a laser diffraction particle size analyzer given 100% as the total volume of the powder groups.

The inorganic component (B) is at least one component selected from the group consisting of boehmite particles and inorganic particles that contain crystal water having a release initiation temperature of 400° C. or higher or contain no crystal water.

The boehmite particles are of an aluminum compound represented by (AlOOH) or ($Al_2O_3 \cdot H_2O$), and are a component that imparts thermal conductivity and fire retardancy without reducing the heat resistance of the laminate.

The average particle diameter ($D_{50}$) of the boehmite particles is 2 to 15 μm, or preferably 3 to 10 μm. If the average particle diameter ($D_{50}$) of the boehmite particles exceeds 15 μm, drilling performance is reduced, while if it is less than 2 μm, thermal conductivity and productivity are reduced.

The inorganic particles that contain crystal water having a release initiation temperature of 400° C. or higher or contain no crystal water are a component that imparts thermal conductivity and fire retardancy without reducing the heat resistance of the circuit board.

Specific examples of inorganic particles include aluminum oxide (no crystal water), magnesium oxide (no crystal water), crystalline silica (no crystal water) and other inorganic oxides; boron nitride (no crystal water), aluminum nitride (no crystal water), silicon nitride (no crystal water) and other inorganic nitrides; silicon carbide (no crystal water) and other inorganic carbides; and talc (release initiation temperature 950° C.), calcined kaolin (no crystal water), clay (release initiation temperature 500 to 1,000° C.) and other natural minerals and the like. These may be used alone, or two or more may be used in combination. Of these, magnesium oxide is especially desirable due to thermal conductivity and excellent drill wear properties.

The crystal water release initiation temperature is measured by thermogravimetric analysis (TGA) or differential scanning calorimetry (DSC).

The average particle diameter ($D_{50}$) of the inorganic particles is 2 to 15 μm or preferably 3 to 10 μm. If the average particle diameter ($D_{50}$) of the inorganic particles exceeds 15 μm there is a risk of reduced drilling performance.

The aluminum oxide particles (C) are a component that imparts high thermal conductivity to the resulting prepreg. The average particle diameter ($D_{50}$) of the aluminum oxide particles (C) is 1.5 μm or less, or preferably 0.4 to 0.8 μm. If the average particle diameter ($D_{50}$) of the aluminum oxide particles (C) exceeds 1.5 μm, it is difficult to compound a sufficient amount into the laminate, and drilling performance is also reduced. If the average particle diameter ($D_{50}$) of the aluminum oxide particles (C) is too small, on the other hand, the thermal conductivity of the prepreg may be insufficient.

The compounded ratio (volume ratio) of the gibbsite aluminum hydroxide particles (A), inorganic component (B) and aluminum oxide particles (C) is 1:0.1 to 2.5:0.1 to 1, or preferably 1:0.5 to 2.5:0.1 to 0.5. If the compounded amount of the inorganic component (B) exceeds 2.5 parts per 1 part of the gibbsite aluminum hydroxide particles (A), the drilling performance and fire retardancy of the resulting laminate are reduced, while below 0.1 heat resistance is reduced. If the compounded amount of the aluminum oxide particles (C) exceeds 1 part per 1 part of the gibbsite aluminum hydroxide particles (A), on the other hand, the drilling performance is reduced, while below 0.1 thermal conductivity is reduced.

Moreover, magnesium oxide particles are preferred as the inorganic component (B) to achieve a balance of thermal conductivity and drilling performance. The specific surface area of these magnesium oxide particles is preferably 0.1 to 1.5 m²/g. The advantage of using magnesium oxide particles with a specific surface area within this range is that no voids occur even when the inorganic filler is highly filled.

The compounded proportion of the inorganic filler per 100 volume parts of the thermosetting resin is 80 to 200 volume parts or preferably 90 to 140 volume parts or more preferably 100 to 130 volume parts. In particular, when the compounded ratio (volume ratio) of the gibbsite aluminum hydroxide particles (A) and the inorganic component (B) is (A):(B)=1:1.5 to 2.5, the compounded proportion of the inorganic filler is preferably 120 volume parts or more per 100 volume parts of the thermosetting resin in order to ensure a fire retardancy of V-0.

If the compounded proportion of the inorganic filler is less than 80 volume parts, the thermal conductivity of the resulting laminate is lower, while if it exceeds 200 volume parts the drilling performance is reduced, and the laminate manufacturing properties (resin impregnation, moldability) are also reduced. In particular, if the compounded proportion of the gibbsite aluminum hydroxide particles (A) is too large, and specifically if it exceeds 100 volume parts, heat resistance tends to be less because too much crystal water is produced.

When the inorganic component (B) comprises boehmite particles compounded with inorganic particles that contain crystal water having a release initiation temperature of 400° C. or higher or contain no crystal water, the compounded proportion of the inorganic particles is 50 vol % or less or preferably 30 vol % or less or especially 20 vol % or less of the total of the inorganic filler.

The thermosetting resin composition is prepared by a well-known preparation method in which an inorganic filler containing the gibbsite aluminum hydroxide particles (A), the inorganic component (B) and the aluminum oxide particles (C) is compounded with a thermosetting resin in a liquid state, and the various inorganic particles are dispersed with a disperser, ball mill, roll or the like. An organic solvent for adjusting viscosity and various additives may also be compounded as necessary.

The prepreg is explained next.

The prepreg is obtained by impregnating a woven fabric base such as a fiberglass cloth (woven cloth) or a synthetic fiber cloth (woven cloth) of a synthetic fiber such as aramid fiber, polyester fiber or nylon fiber with a resin varnish.

The resin varnish for forming the prepreg may be a resin varnish in which the resin component is an epoxy resin or an unsaturated polyester resin, vinyl ester resin or other radical polymerizable thermosetting resin. Suitable amounts of various reaction initiators, curing agents and fillers can also be compounded as necessary in the resin varnish for forming the prepreg. Suitable fillers may also be compounded to the extent that they do not detract from the effects of the invention.

It is desirable to use a thermosetting resin composition comprising the inorganic fillers shown below as the thermosetting resin composition contained in the resin varnish impregnating the woven fabric base. That is, it is desirable to use a thermosetting resin composition that contains 80 to 200 volume parts of an inorganic filler per 100 volume parts of a thermosetting resin, wherein the inorganic filler comprises gibbsite aluminum hydroxide particles (A) having an average particle diameter ($D_{50}$) of 2 to 15 μm, at least one inorganic component (B) selected from the group consisting of boehmite particles having an average particle diameter ($D_{50}$) of 2 to 15 μm and inorganic particles that have an average particle diameter ($D_{50}$) of 2 to 15 μm and that contain crystal water having a release initiation temperature of 400° C. or higher or contain no crystal water, and aluminum oxide particles (C) having an average particle diameter ($D_{50}$) of 1.5 μm or smaller, and the compounded ratio (volume ratio) of the gibbsite aluminum hydroxide particles (A), the inorganic component (B) and the aluminum oxide particles (C) is 1:0.1 to 2.5:0.1 to 1.

[Laminate]

Figure 1B:
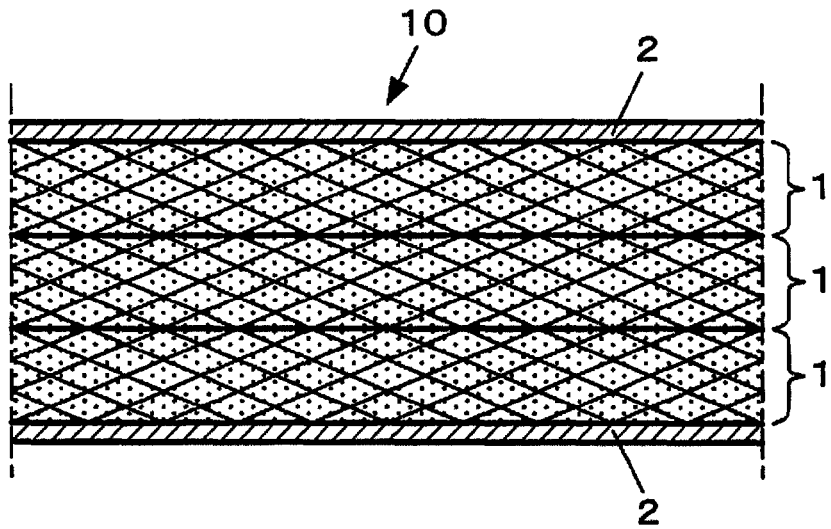
Figure 1C:
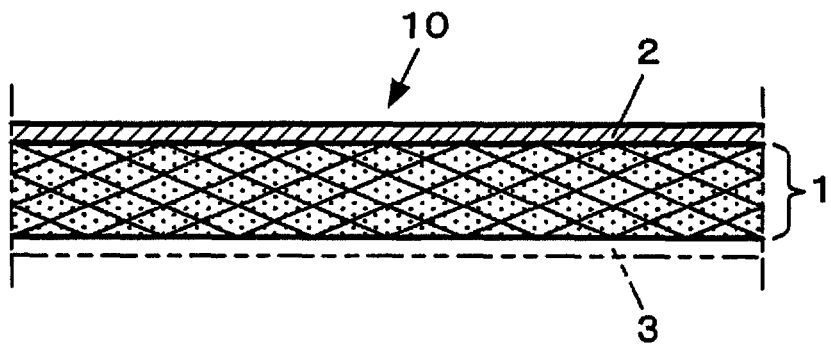

Laminate 10 of one embodiment of the present invention is explained with reference to FIGS. 1A to 1C.

Laminate 10 normally has a layered composition comprising multiple sheets of a prepreg laminated as a unit. Metal foil 3 is then laminated on the surface to form a metal clad laminate.

For the prepreg, a fiberglass cloth or other woven fiber base 1a is impregnated with resin composition 1b.

One or multiple sheets of the prepreg are then laminated, metal foil 2 or a release film is laminated on the surface, and this laminate is then laminate molded to obtain a laminate or metal clad laminate. One sheet may be used for each prepreg, or multiple sheets (specifically 1 to 3 layers) may be used appropriately according to the object.

The metal foil is not particularly limited, and copper foil, aluminum foil, nickel foil or the like may be used. The metal foil may be disposed on both surfaces or on only one surface. The laminate may also be heat and pressure molded with a release film 3 disposed instead of the metal film on the surface without the metal film.

In the prepreg of this embodiment, because the gibbsite aluminum hydroxide particles (A) are compounded and a suitable amount of the aluminum oxide particles (C) with a small average particle diameter are also compounded in the resin composition, it is possible to control wear of the drill blade during drilling of the laminate. Drill life can be extended as a result. When drilling is used to form through holes, moreover, bumps and indentations are less likely to form on the inner surface of the formed holes, which can thus be formed with smooth inner surfaces. This means that when the inner surfaces of the holes are hole plated to form through holes, therefore, the resulting through holes can then have high conduction reliability. The thermal conductivity of the laminate can also be greatly improved by compounding the aluminum oxide particles (C), which have excellent thermal conductivity. The drilling performance of the laminate is not greatly affected because the compounded aluminum oxide particles (C) have a small particle diameter. Thermal conductivity can also be imparted without greatly reducing the heat resistance and drilling performance by compounding the inorganic component (B).

The prepreg with excellent thermal conductivity and drilling performance of this embodiment can be used favorably in applications for which good heat dissipation properties are required, such as the printed wiring boards of LED backlight units such as those mounted in liquid crystal displays, or printed wiring boards for LED illumination and the like.

Figure 2:
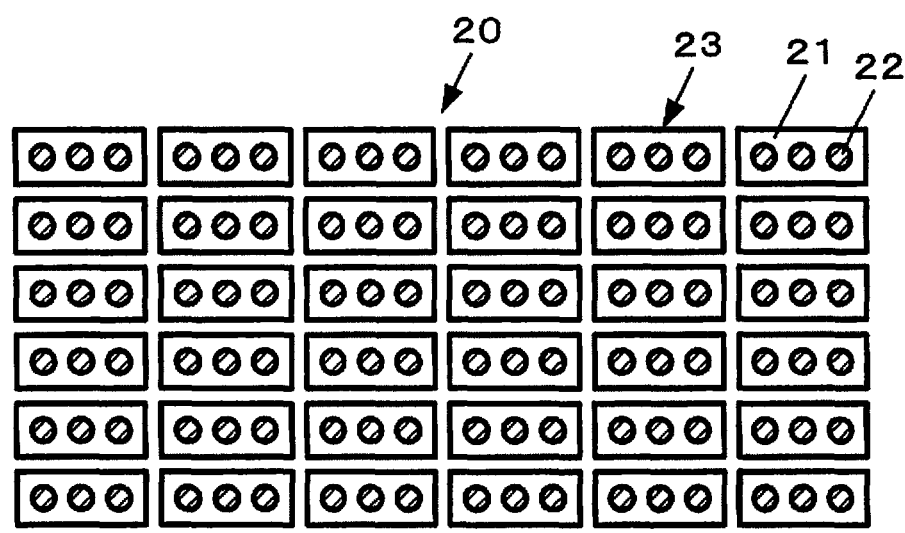
FIG. 2 shows the configuration of an LED backlight unit.

Specifically, as shown in top view in FIG. 2, one example of an LED application is an LED backlight unit 20 such as those mounted in liquid crystal displays. LED backlight unit 20 in FIG. 2 is composed of an array of multiple LED modules 23 each comprising multiple (three in FIG. 2) LEDs 22 mounted on a printed wiring board 21, and is used to backlight a liquid crystal display or the like when disposed behind a liquid crystal panel. Conventionally, cold-cathode tube (CCFL) type backlights have been popular as backlights for widely-used types of conventional liquid crystal displays, but in recent years LED backlights such as those described above have been actively developed because they offer the advantages of improved picture quality due to a broader color spectrum in comparison with cold-cathode tube backlights, as well as a lower environmental impact because no mercury is used, and the possibility of thinner applications.

In general, LED modules use more power than cold-cathode tubes, and therefore generate more heat. The problem of heat dissipation is greatly improved by using the composite laminate of the present invention as printed wiring board 21, which requires a high level of heat dissipation. The luminous efficiency of the LED is thereby improved.

The present invention is explained in more detail by means of examples. However, the present invention is not in any way limited by the examples.

EXAMPLES

First, a phosphorous-containing epoxy resin was prepared as shown below as the thermosetting resin composition for use in the examples.

(Phosphorous-Containing Epoxy Resin)

130 weight parts of HCA and 400 weight parts of xylene as a reaction solvent were loaded into a 4-necked glass separable flask equipped with an agitator, a thermometer, a cooling tube and a nitrogen gas introduction unit, and heated and dissolved. Next, 94 weight parts of 1,4-naphthoquinone were added separately with attention paid to the temperature rise caused by reaction heat. The amount of the phosphorous compound HCA was 1.02 moles per 1 mole of 4-napthoquinone. Following the reaction, 300 weight parts of the solvent were collected, 350 weight parts of EPPN-501H (trifunctional epoxy resin, epoxy equivalent 165 g/eq, Nippon Kayaku Co., Ltd.), 250 weight parts of Epotohto ZX-1355 (1,4-dihydroxynaphthalene epoxy resin, epoxy equivalent 145 g/eq, Tohto Kasei Co., Ltd.) and 176 weight parts of Epotohto YDF-170 (bisphenol F epoxy resin, epoxy equivalent 168 g/eq, Tohto Kasei Co., Ltd.) were loaded, nitrogen gas was introduced as the mixture was heated and agitated, and the solvent was again collected. 0.22 weight parts of triphenylphosphine were added as a solvent, and reacted for 4 hours at 160° C. The resulting epoxy resin was 42.6 wt %, the epoxy equivalent weight was 273.5 g/eq, and the phosphorous content was 1.85 wt %.

Example 1

(Manufacture of Prepreg)

35 volume parts of gibbsite aluminum hydroxide (Sumitomo Chemical, $D_{50}$=5.4 μm), 35 volume parts of gibbsite aluminum hydroxide (Sumitomo Chemical, $D_{50}$=12.6 μm), 15 volume parts of boehmite ($D_{50}$=5.5 μm) and 15 volume parts of aluminum oxide (Sumitomo Chemical, $D_{50}$=0.76 μm) were compounded per 100 volume parts of the thermosetting resin component of a thermosetting resin varnish comprising a phosphorous-containing epoxy resin prepared by the aforementioned methods and a dicyandiamide (Dicy) curing agent, and uniformly dispersed. A prepreg was obtained by impregnating a fiberglass cloth (Nitto Boseki Co., Ltd.) with a weight per unit area of 47 g/m² and a thickness of 53 μm with the resin varnish having the compounded filler. The cloth volume was 12 vol %.

Six sheets of this prepreg were stacked, and a 0.018 mm-thick copper foil was laid over both outer surfaces to obtain a laminate. This laminate was sandwiched between two metal plates, and heat molded under conditions of temperature 180° C., pressure 30 kg/m² to obtain a copper clad laminate 0.8 mm in thickness.

The thermal conductivity, 220° C. oven heat resistance, 260° C. solder heat resistance, pressure cooker test (PCT) reliability, drill wear rate, and fire retardancy of the obtained copper clad laminate were evaluated under the following evaluation conditions. The results are shown in Tables 1 and 2 below. In Tables 1 to 4 below, the values shown in parentheses for each Example and Comparative Example represent the compounded proportions of the boehmite particles, the various organic particles and the aluminum oxide particles per 1 volume part of the gibbsite aluminum hydroxide particles.

(Thermal Conductivity)

The copper foil was peeled from the resulting copper clad laminate, the density of the laminate without the copper foil was measured by the water displacement method, and the specific heat was measured by DSC (differential scanning calorimetry), while thermal diffusivity was measured by the laser flash method.

Thermal conductivity was then calculated by the following formula:

Thermal conductivity(W/m·K)=density(kg/m³)×specific heat(kJ/kg·K)×thermal diffusivity(m²/S)×1,000.

(220° C. Oven Heat Resistance Test)

Using the resulting copper clad laminate, a test piece prepared in accordance with JIS C 6481 was treated for 1 hour in a thermostatic tank with an air circulation mechanism, and given a grade of "superior" if there was no blistering or peeling of the copper foil or laminate, or "poor" if there was blistering or peeling.

(260° C. Solder Heat Resistance Test)

Using the resulting copper clad laminate, a test piece prepared in accordance with JIS C 6481 was dipped in a 260° C. solder bath, and the maximum time during which no blistering or peeling of the copper foil and laminate occurred was determined.

(Pressure Cooker Test (PCT))

Using the resulting copper clad laminate, a test piece prepared in accordance with JIS C 6481 was treated for 60 minutes at 121° C. in an autoclave at 2 atmospheres. The treated laminate was then dipped in a 260° C. solder tank, and the maximum time during which no blistering or peeling of the copper foil and laminate occurred was determined.

(Drill Wear Rate)

Two of the resulting laminates were superimposed, 1,000 holes were drilled with a drill (di. 0.3 mm) at a rate of 160,000 rpm, and the wear rate of the drill blade was evaluated as the ratio (percentage) of the size of the drill blade (area) worn by drilling to the size (area) of the drill blade before drilling.

(Fire Retardancy)

The resulting copper clad laminate was cut to a specific size, combustion tested in accordance with the UL-94 combustion test methods, and evaluated.

Examples 2 to 19 and Comparative Examples 1 to 20

Laminates were obtained as in Example 1 except that the makeup of the resin composition was varied as shown in Tables 1 to 4 when manufacturing the core layer prepreg. The results for Example 1 and Examples 2 to 19 are shown in Tables 1 and 2, while the results for Comparative Examples 1 to 20 are shown in Tables 3 and 4.

The materials used in the respective examples and comparative examples are as follows.

(B1) Talc of average particle diameter ($D_{50}$) 5.5 μm (Fuji Talc Industrial Co., Ltd.)
(B2) Crystalline silica of average particle diameter ($D_{50}$) 6.5 μm
(B4) Magnesium oxide of average particle diameter ($D_{50}$) 6.5 μm, specific surface area (BET) 1.0 m²/g
(B5) Aluminum nitride of average particle diameter ($D_{50}$) 6.6 μm (Furukawa Denshi Co., Ltd.)
(B6) Magnesium oxide of average particle diameter ($D_{50}$) 5 μm, specific surface area (BET) 2.5 m²/g
Aluminum oxide particles of average particle diameter ($D_{50}$) 4 μm (Sumitomo Chemical)

TABLE 1

| | | Ex 1 | Ex 2 | Ex 3 | Ex 4 | Ex 5 | Ex 6 | Ex 7 | Ex 8 | Ex 9 | Ex 10 |
|---|---|---|---|---|---|---|---|---|---|---|---|
| Composition | (A1) Aluminum hydroxide (5.4μ) | 35 | 70 | — | 35 | — | 63 | 20 | 35 | 70 | — |
| | (A2) Aluminum hydroxide (12.6μ) | 35 | — | 70 | — | 60 | 63 | 20 | 35 | — | 70 |
| | (B) Boehmite (5.5μ) | 15 | 15 | 15 | 35 | 30 | 27 | 20 | — | — | — |
| | (B1) Talc (5.5μ) | — | — | — | 10 | — | — | — | 15 | 15 | 15 |
| | (B2) Crystalline silica (6.5μ) | — | — | — | — | — | — | — | — | — | — |
| | (B4) MgO (6.5μ) BET 1.0 m$^2$/g | — | — | — | — | — | — | — | — | — | — |
| | (B5) Aluminum nitride (6.6μ) | — | — | — | — | — | — | — | — | — | — |
| | (B6) MgO (5μ) BET 2.5 m$^2$/g | — | — | — | — | — | — | — | — | — | — |
| | (C) Alumina (0.76μ) | 15 | 15 | 15 | 30 | 10 | 27 | 20 | 15 | 15 | 15 |
| | Alumina (4μ) | — | — | — | — | — | — | — | — | — | — |
| | Inorganic filler (vol. pts.) | 100 | 100 | 100 | 110 | 100 | 180 | 80 | 100 | 100 | 100 |
| | Epoxy resin (vol. pts.) | 100 | 100 | 100 | 100 | 100 | 100 | 100 | 100 | 100 | 100 |
| | Cloth content (vol %) | 12 | 12 | 12 | 12 | 12 | 12 | 12 | 12 | 12 | 12 |
| Examples | Thermal conductivity | 1.3 | 1.2 | 1.3 | 1.6 | 1.2 | 1.9 | 1.4 | 1.3 | 1.3 | 1.4 |
| | 220° C. oven heat resistance | 230 | 230 | 230 | 250 | 240 | 220 | 250 | 230 | 230 | 230 |
| | 260° C. solder heat resistance | 180 | 180 | 180 | 180 | 180 | 180 | 180 | 180 | 180 | 180 |
| | PCT | 180 | 180 | 180 | 180 | 180 | 180 | 180 | 180 | 180 | 180 |
| | Drill wear 1,000 hits | 45 | 45 | 47 | 52 | 39 | 55 | 52 | 42 | 41 | 42 |
| | Fire retardancy | V-0 | V-0 | V-0 | V-0 | V-0 | V-0 | V-0 | V-0 | V-0 | V-0 |
| | Voids | No | No | No | No | No | No | No | No | No | No |

TABLE 2

| | | Ex 11 | Ex 12 | Ex 13 | Ex 14 | Ex 15 | Ex 16 | Ex 17 | Ex 18 | Ex 19 |
|---|---|---|---|---|---|---|---|---|---|---|
| Composition | (A1) Aluminum hydroxide (5.4μ) | 55 | — | 25 | 35 | 35 | 35 | 45 | 45 | 30 |
| | (A2) Aluminum hydroxide (12.6μ) | — | 60 | 25 | 35 | 35 | 35 | — | — | — |
| | (B) Boehmite (5.5μ) | — | — | — | — | — | — | 15 | — | — |
| | (B1) Talc (5.5μ) | 35 | 30 | 10 | — | — | — | — | — | — |
| | (B2) Crystalline silica (6.5μ) | — | — | — | 15 | — | — | — | — | — |
| | (B4) MgO (6.5μ) BET 1.0 m$^2$/g | — | — | — | — | 15 | — | 25 | 97.5 | — |
| | (B5) Aluminum nitride (6.6μ) | — | — | — | — | — | 15 | — | — | — |
| | (B6) MgO (5μ) BET 2.5 m$^2$/g | — | — | — | — | — | — | — | — | 65 |
| | (C) Alumina (0.76μ) | 20 | 10 | 20 | 15 | 15 | 15 | 15 | 7.5 | 5 |
| | Alumina (4μ) | — | — | — | — | — | — | — | — | — |
| | Inorganic filler (vol. pts.) | 110 | 100 | 80 | 100 | 100 | 100 | 100 | 150 | 150 |
| | Epoxy resin (vol. pts.) | 100 | 100 | 100 | 100 | 100 | 100 | 100 | 100 | 100 |
| | Cloth content (vol %) | 12 | 12 | 12 | 12 | 12 | 12 | 12 | 12 | 12 |
| Examples | Thermal conductivity | 1.5 | 1.3 | 1.2 | 1.4 | 1.3 | 1.4 | 1.4 | 1.6 | 1.6 |
| | 220° C. oven heat resistance | 240 | 230 | 240 | 230 | 230 | 230 | 230 | 250 | 250 |
| | 260° C. solder heat resistance | 180 | 180 | 180 | 180 | 180 | 180 | 180 | 180 | 180 |
| | PCT | 180 | 180 | 180 | 180 | 180 | 180 | 180 | 180 | 180 |
| | Drill wear 1,000 hits | 50 | 37 | 43 | 42 | 42 | 42 | 65 | 55 | 55 |
| | Fire retardancy | V-0 | V-0 | V-0 | V-0 | V-0 | V-0 | V-0 | V-0 | V-0 |
| | Voids | No | No | No | No | No | No | No | No | Yes |

TABLE 3

| | | CE 1 | CE 2 | CE 3 | CE 4 | CE 5 | CE 6 | CE 7 | CE 8 | CE 9 | CE 10 |
|---|---|---|---|---|---|---|---|---|---|---|---|
| Composition | (A1) Aluminum hydroxide (5.4μ) | — | 100 | — | 70 | 70 | 122 | 103 | 35 | 35 | 80 |
| | (A2) Aluminum hydroxide (12.6μ) | — | — | 100 | — | — | — | — | 35 | — | 40 |
| | (B) Boehmite (5.5μ) | — | — | — | 30 | — | — | — | 15 | 25 | — |

TABLE 3-continued

|  |  | CE 1 | CE 2 | CE 3 | CE 4 | CE 5 | CE 6 | CE 7 | CE 8 | CE 9 | CE 10 |
|---|---|---|---|---|---|---|---|---|---|---|---|
|  | (B1) Talc (5.5μ) | — | — | — | — | — | — | — | — | — | — |
|  | (B2) Crystalline silica (6.5μ) | — | — | — | — | — | — | — | — | — | — |
|  | (B4) MgO (6.5μ) | — | — | — | — | — | — | — | — | — | — |
|  | (B5) Aluminum nitride (6.6μ) | — | — | — | — | — | — | — | — | — | — |
|  | (C) Alumina (0.76μ) | — | — | — | — | 30 | — | — | — | 40 | 15 |
|  | Alumina (4μ) | — | — | — | — | — | — | — | 15 | — | — |
|  | Inorganic filler (vol. pts.) | 0 | 100 | 100 | 100 | 100 | 122 | 103 | 100 | 100 | 150 |
|  | Epoxy resin (vol. pts.) | 100 | 100 | 100 | 100 | 100 | 100 | 100 | 100 | 100 | 100 |
|  | Cloth content (vol %) | 12 | 12 | 12 | 12 | 12 | 12 | 12 | 12 | 12 | 12 |
| Examples | Thermal conductivity | 0.8 | 1.1 | 1.2 | 1.1 | 1.5 | 1.3 | 1.1 | 1.8 | 1.0 | 1.5 |
|  | 220° C. oven heat resistance | — | <220 | <220 | 230 | 230 | <220 | <220 | 230 | 230 | <220 |
|  | 260° C. solder heat resistance | — | 106 | 72 | 180 | 180 | 79 | 106 | 180 | 180 | 60 |
|  | PCT | — | 64 | 41 | 180 | 180 | 41 | 64 | 180 | 180 | 28 |
|  | Drill wear 1,000 hits | 15 | 23 | 28 | 27 | 57 | 31 | 23 | 100 | 66 | 51 |
|  | Fire retardancy | V-0 | V-0 | V-0 | V-0 | V-0 | V-0 | V-0 | V-0 | V-1 | V-0 |

TABLE 4

|  |  | CE 11 | CE 12 | CE 13 | CE 14 | CE 15 | CE 16 | CE 17 | CE 18 | CE 19 | CE 20 |
|---|---|---|---|---|---|---|---|---|---|---|---|
| Composition | (A1) Aluminum hydroxide (5.4μ) | — | — | — | — | 35 | — | 35 | 80 | 40 | 25 |
|  | (A2) Aluminum hydroxide (12.6μ) | — | — | — | — | 35 | — | — | 40 | — | — |
|  | (B) Boehmite (5.5μ) | — | — | — | — | — | — | — | — | — | — |
|  | (B1) Talc (5.5μ) | — | 100 | — | — | 15 | 70 | 25 | 15 | 15 | 70 |
|  | (B2) Crystalline silica (6.5μ) | — | — | — | — | — | — | — | — | — | — |
|  | (B4) MgO (6.5μ) | — | — | — | — | — | — | — | — | — | — |
|  | (B5) Aluminum nitride (6.6μ) | — | — | — | — | — | — | — | — | — | — |
|  | (C) Alumina (0.76μ) | — | — | 100 | — | — | 30 | 40 | 15 | 15 | 5 |
|  | Alumina (4μ) | — | — | — | 100 | 15 | — | — | — | — | — |
|  | Inorganic filler (vol. pts.) | 0 | 100 | 100 | 100 | 100 | 100 | 100 | 150 | 70 | 100 |
|  | Epoxy resin (vol. pts.) | 100 | 100 | 100 | 100 | 100 | 100 | 100 | 100 | 100 | 100 |
|  | Cloth content (vol %) | 16 | 12 | 12 | 12 | 12 | 12 | 12 | 12 | 12 | 12 |
| Examples | Thermal conductivity | 0.6 | 1.2 | 1.9 | 2.6 | 1.4 | 1.5 | 1.6 | 1.9 | 1.0 | 1.4 |
|  | 220° C. oven heat resistance | 250 | 250 | 250 | 250 | 230 | 250 | 250 | 220 | 240 | 240 |
|  | 260° C. solder heat resistance | 180 | 180 | 180 | 180 | 180 | 180 | 180 | 80 | 180 | 180 |
|  | PCT | 180 | 180 | 180 | 180 | 180 | 180 | 180 | 28 | 180 | 180 |
|  | Drill wear 1,000 hits | 52 | 25 | 100 | 100 | 63 | 80 | 71 | 53 | 34 | 51 |
|  | Fire retardancy | V-0 | V-1 | V-1 | V-1 | V-0 | V-1 | V-1 | V-0 | V-1 | V-1 |

As shown in Tables 1 and 2, Examples 1 to 19 all exhibited high values of 1.2 (W/(m·K)) or more for thermal conductivity. Heat resistance was also excellent in all tests. The drill wear rate was also 65% or less. Fire resistance was at the V-0 level in all cases.

Moreover, Example 18 shows that a laminate with a good balance of high thermal conductivity, high fire retardancy and low drill wear can be obtained by including magnesium oxide as the inorganic component (B). However, as shown by Example 19, including magnesium oxide with a high specific surface area creates a problem of voids occurring in the laminate.

On the other hand, as shown in Tables 3 and 4, when no inorganic filler was included (Comparative Example 1) thermal conductivity was low, and no heat resistance at all was obtained. When the content of the gibbsite aluminum hydroxide was high (Comparative Examples 2, 3, 6, 7, 10, 18), heat resistance was reduced. When only gibbsite aluminum hydroxide and boehmite particles were included (Comparative Example 4), thermal conductivity was low, while when only gibbsite aluminum hydroxide and aluminum oxide were included (Comparative Example 5), drill wear increased. When no gibbsite aluminum hydroxide or inorganic component (B) was included (Comparative Example 11), thermal conductivity was much lower. When aluminum oxide having an average particle diameter of 4 μm was used (Comparative Examples 8, 14, 15), there was much more drill wear. When only inorganic component (B) was included without any gibbsite aluminum hydroxide (Comparative Examples 12, 13, 14, 16), fire retardancy was at the V-1 level. When the compounded proportion of aluminum oxide having an average particle diameter of 0.76 μm was high, 1.1 parts per 1 volume part of gibbsite aluminum hydroxide (Comparative Examples 9, 17), drill wear was much greater, and fire retardancy was at the V-1 level. When only 70 parts of inorganic filler were included per 100 volume parts of thermosetting resin (Comparative Example 19), thermal conductivity was reduced and fire retardancy was at the V-1 level. When the compounded proportion of talc (inorganic component B) exceeded 2.5 parts per 1 volume part of the gibbsite aluminum hydroxide (Comparative Example 20), fire retardancy was at the V-1 level.

As explained above, one aspect of the present invention is a prepreg comprising a woven fabric base impregnated with a thermosetting resin composition, wherein the thermosetting resin composition contains 80 to 200 volume parts of an inorganic filler per 100 volume parts of a thermosetting resin, the inorganic filler comprises (A) gibbsite aluminum hydroxide particles having an average particle diameter ($D_{50}$) of 2 to 15 μm, (B) at least one inorganic component selected from the group consisting of boehmite particles having an average particle diameter ($D_{50}$) of 2 to 15 μm and inorganic particles that have an average particle diameter ($D_{50}$) of 2 to 15 μm and that contain crystal water having a release initiation temperature of 400° C. or higher or contain no crystal water, and (C) aluminum oxide particles having an average particle diameter ($D_{50}$) of 1.5 μm or smaller, and the compounded ratio (volume ratio) of the gibbsite aluminum hydroxide particles (A), the at least one inorganic component (B) selected from the group consisting of the boehmite particles and the inorganic particles, and the aluminum oxide particles (C) is 1:0.1 to 2.5:0.1 to 1.

With this configuration, a laminate is obtained with excellent thermal conductivity, heat resistance, drilling performance and fire retardancy. Drilling performance is greatly reduced if ordinary aluminum oxide is compounded in a thermosetting resin composition with the aim of improving thermal conductivity. This is because aluminum oxide is very hard. In the present invention, heat resistance is greatly improved without any loss of drilling performance by compounding a specific proportion of aluminum oxide with a very small particle diameter.

Moreover, the aluminum compound gibbsite aluminum hydroxide ($Al(OH)_3$ or $Al_2O_3 \cdot 3H_2O$) is a component that imparts a good balance of thermal conductivity, drilling performance and fire retardancy. Because gibbsite aluminum hydroxide has the latent property of releasing crystal water at about 200 to 230° C., it has a particularly strong ability to impart fire retardancy in particular. However, if the compounded proportion is too great it can be a cause of blisters and the like during solder reflow.

Moreover, the aluminum compound boehmite (AlOOH) helps to impart thermal conductivity and heat resistance on the laminate. Because boehmite has the latent property of releasing crystal water at about 450 to 500° C., it is even more heat resistant than gibbsite aluminum hydroxide. It also provides fire retardancy at high temperatures.

Similarly, the inorganic particles that contain crystal water having a release initiation temperature of 400° C. or higher or contain no crystal water help to impart thermal conductivity and heat resistance to the laminate. The occurrence of blisters during reflow soldering of the circuit board can be controlled by compounding such inorganic particles. They also provide fire retardancy at high temperatures.

In the present invention, a thermosetting resin composition that yields a laminate combining excellent thermal conductivity, excellent heat resistance, excellent drilling performance and fire retardancy is obtained by using an inorganic filler comprising gibbsite aluminum hydroxide particles (A) having a specific average particle diameter ($D_{50}$), at least one inorganic component (B) having a specific average particle diameter ($D_{50}$) and selected from the group consisting of boehmite particles and inorganic particles that contain crystal water having a release initiation temperature of 400° C. or higher or contain no crystal water, and aluminum oxide particles (C) having a small particle diameter ($D_{50}$), compounded in the specific proportions described above.

A laminate obtained using this thermosetting resin composition can be used favorably in various boards for which good heat dissipation is required, and particularly in boards for LED mounting, such as those for mounting multiple LEDs that generate large quantities of heat. When a printed wiring board comprising this laminate is mounted on the surface of various electronic components, the metal foil does not blister even at a temperature of about 260° C., which is the reflow temperature of lead-free solder.

Moreover, the gibbsite aluminum hydroxide particles (A) are preferably a compounded mixture of first gibbsite aluminum hydroxide particles having an average particle diameter ($D_{50}$) of 2 to 10 μm and second gibbsite aluminum hydroxide particles having an average particle diameter ($D_{50}$) of 10 to 15 μM. With this configuration, a laminate with particularly good thermal conductivity is obtained because the inorganic filler can be more densely filled.

At least one kind of particles selected from the group consisting of aluminum oxide, magnesium oxide, crystalline silica, aluminum hydroxide, boron nitride, aluminum nitride, silicon nitride, silicon carbide, talc, calcined kaolin and clay can preferably be used as the inorganic particles that are one kind of the inorganic component (B).

A laminate obtained by laying surface layers obtained by impregnating a woven fabric base with a thermosetting resin composition comprising components similar to those of the aforementioned thermosetting resin composition compounded in similar proportions on both sides of the aforementioned core layer and laminating them together is preferred. With this configuration, it is possible to obtain a laminate that combines the properties excellent thermal conductivity, excellent heat resistance, superior drilling performance and fire retardancy.

A circuit board obtained from such a laminate has excellent heat dissipation properties, fire retardancy and especially drilling performance. Thus, it can be used favorably as a circuit board for mounting electronic members that require heat dissipation, such as LEDs.

INDUSTRIAL APPLICABILITY

A laminate and circuit board with excellent thermal conductivity, heat resistance, drilling performance and fire retardancy are obtained with the present invention.

The invention claimed is:

1. A prepreg obtained by impregnating a woven fabric base with a thermosetting resin composition,
wherein the thermosetting resin composition contains 80 to 200 volume parts of an inorganic filler per 100 volume parts of a thermosetting resin, and
the inorganic filler contains (A) gibbsite aluminum hydroxide particles having an average particle diameter ($D_{50}$) of 2 to 15 μm, (B) at least one inorganic component selected from the group consisting of boehmite particles having an average particle diameter ($D_{50}$) of 2 to 15 μm and inorganic particles that have an average particle diameter ($D_{50}$) of 2 to 15 μm and that contain crystal water having a release initiation temperature of 400° C. or higher or contain no crystal water, and (C) aluminum oxide particles having an average particle diameter ($D_{50}$) of 1.5 μm or smaller,
the compounded ratio (volume ratio) of the gibbsite aluminum hydroxide particles (A), the at least one inorganic component (B) selected from the group consisting of the boehmite particles and the inorganic particles, and the aluminum oxide particles (C) being 1:0.1 to 2.5:0.1 to 1.

2. The prepreg according to claim 1, wherein the gibbsite aluminum hydroxide particles (A) are a compounded mixture of first gibbsite aluminum hydroxide particles having an average particle diameter ($D_{50}$) of 2 to 10 μm and second gibbsite aluminum hydroxide particles having an average particle diameter ($D_{50}$) of 10 to 15 μm.

3. The prepreg according to claim 1, wherein the inorganic particles that are one kind of the inorganic component (B) are at least one of particles selected from the group consisting of aluminum oxide, magnesium oxide, crystalline silica, aluminum hydroxide, boron nitride, aluminum nitride, silicon nitride, silicon carbide, talc, calcined kaolin and clay.

4. The prepreg according to claim 1, wherein the inorganic component (B) is magnesium oxide.

5. The prepreg according to claim 4, wherein the specific surface area of the magnesium oxide is 0.1 to 1.5 $m^2/g$.

6. A metal clad laminate comprising a metal foil laid on at least one surface of the prepreg according to claim 1.

7. A circuit board obtained by forming circuits on the metal clad laminate according to claim 6.

8. A circuit board for LED mounting comprising the circuit board according to claim 7.

\* \* \* \* \*